(12) United States Patent
Kim

(10) Patent No.: US 7,580,299 B2
(45) Date of Patent: Aug. 25, 2009

(54) CIRCUIT FOR GENERATING A REFERENCE VOLTAGE

(75) Inventor: You Sung Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 115 days.

(21) Appl. No.: 11/771,817

(22) Filed: Jun. 29, 2007

(65) Prior Publication Data

US 2008/0175087 A1    Jul. 24, 2008

(30) Foreign Application Priority Data

Jan. 23, 2007    (KR) .................. 10-2007-0007044

(51) Int. Cl.
*G11C 5/14* (2006.01)

(52) U.S. Cl. .................. 365/189.09; 365/177; 365/179; 327/539

(58) Field of Classification Search ............ 365/189.09, 365/177, 179, 226; 327/539
See application file for complete search history.

(56) References Cited

U.S. PATENT DOCUMENTS 7,205,755 B2 *    4/2007    Ito et al. ..................... 323/316

2005/0185491 A1 *    8/2005    Kim et al. ..................... 365/222
2008/0042737 A1 *    2/2008    Kim et al. ..................... 327/539

FOREIGN PATENT DOCUMENTS

| KR | 100143344 B1 | 4/1998 |
| KR | 1020020002509 A | 1/2002 |
| KR | 1020020002951 A | 1/2002 |
| KR | 1020040007124 A | 1/2004 |

* cited by examiner

*Primary Examiner*—Tuan T Nguyen
*Assistant Examiner*—Toan Le
(74) *Attorney, Agent, or Firm*—Townsend and Townsend and Crew LLP

(57) ABSTRACT

A circuit for generating a reference voltage in a memory device includes a switching section, a first voltage generator, a second voltage generator and a comparator. The switching section controls a supply of a power supply voltage in response to a control signal. The first voltage generator generates a reference voltage and a first voltage by dividing the power supply voltage provided through the switching section, and has a negative temperature coefficient characteristic. The second voltage generator generates the reference voltage and a second voltage having a positive temperature coefficient characteristic. The comparator compares the first voltage with the second voltage, and controls the switching section in accordance with the comparison result.

4 Claims, 3 Drawing Sheets

CIRCUIT FOR GENERATING A REFERENCE VOLTAGE

CROSS-REFERENCE TO RELATED APPLICATIONS

This application claims priority from Korean Patent Application No. 2007-7044, filed on Jan. 23, 2007, the contents of which are incorporated herein by reference in its entirety.

BACKGROUND OF THE INVENTION

The present invention relates to a circuit for generating a reference voltage in a memory device. More particularly, the present invention relates to a circuit for generating a reference voltage optimized for a surrounding temperature.

It is important to maintain a stable internal operation voltage in a semiconductor memory device so as to ensure operation stability and reliability of the semiconductor memory device.

Specially, even though an outside power supply voltage is changed, the changed outside power supply voltage should not affect the internal voltage of the semiconductor memory device. Hence, a circuit for generating a reference voltage having a constant voltage level is required for stably operating the semiconductor memory device.

Recently, as the semiconductor memory device shrinks there has been a need for a circuit for supplying a low power supply voltage. Accordingly, the circuit for generating the reference voltage is required even more in this semiconductor memory device.

The reference voltage outputted from the circuit for generating the reference voltage will vary in accordance with a change in the power supply voltage inputted from an outside apparatus (not shown), the process of manufacturing the semiconductor memory device and a change in temperature. That is, the reference voltage has high deviation in accordance with the change and the process.

FIG. 1 is a view illustrating a threshold voltage distribution of a memory cell at two temperatures in a common semiconductor memory device.

FIG. 1 shows the threshold voltage distribution of the memory cell in accordance with a program state of the memory cell. Here, the threshold voltage distribution has a state 1 and a state 2.

In the state 1, data is read by using a first read voltage $V_{read1}$, and a verifying operation for a program data is performed by using a first verifying voltage $V_{verify1}$. In addition, in the state 2, data is read by using a second read voltage $V_{read2}$, and a verifying operation for a program data is performed by using a second verifying voltage $V_{verify2}$. Here, the read voltages $V_{read1}$ and $V_{read2}$, and the verifying voltages $V_{verify1}$ and $V_{verify2}$ are applied to a word line when the data in the memory cell are read or verified. These voltages $V_{read1}$, $V_{read2}$, $V_{verify1}$ and $V_{verify2}$ are generated on the basis of the reference voltage so that the voltages $V_{read1}$, $V_{read2}$, $V_{verify1}$ and $V_{verify2}$ should not be changed in accordance with PVT (process, voltage and temperature).

However, since the memory cell in the memory device has the characteristic of an N-MOS transistor, the threshold voltage of the memory cell is changed depending on the temperature.

In other words, the threshold voltage of the memory cell is decreased as the temperature is increased. As a result, a cell distribution of the memory cell is changed as shown in FIG. 1 in accordance with the temperature.

Accordingly, the memory cell has the cell distribution shown in a solid line of FIG. 1 when the temperature is high. However, the cell distribution of the memory cell is changed as shown in a dotted line of FIG. 1 when the temperature is low.

As mentioned above, the circuit for generating the reference voltage is set to generate the reference voltage having a constant value irrespective of the PVT. However, the circuit does not take into consideration the threshold voltage change of the memory cell in accordance with the temperature. Hence, a read or program error may occur in the memory cell.

SUMMARY OF THE INVENTION

The present invention relates to a circuit for generating a reference voltage adjusted in accordance with a temperature in a memory device.

A circuit for generating a reference voltage according to one example embodiment of the present invention includes a switching section, a first voltage generator, a second voltage generator and a comparator. The switching section controls a supply of a power supply voltage in response to a control signal. The first voltage generator generates a reference voltage and a first voltage by dividing the power supply voltage provided through the switching section, and has a negative temperature coefficient characteristic. The second voltage generator generates the reference voltage and a second voltage having a positive temperature coefficient characteristic. The comparator compares the first voltage with the second voltage, and controls the switching section in accordance with the comparison result.

The first voltage generator includes a first resistor coupled between a first terminal of the switching section and a first node, the power supply voltage being coupled to a second terminal of the switching section; and a transistor coupled between the first node and a ground voltage. Here, the reference voltage is outputted through the first terminal of the switching section, and the first voltage is outputted through the first node.

The second voltage generator includes a variable resistor section coupled between the first terminal of the switching section and a third node; and a plurality of transistors coupled in parallel between the third node and the ground voltage. Here, the second voltage is outputted through the third node.

The variable resistor section includes at least one resistor, each of the resistors being operated in accordance with a cutting of a fuse.

The variable resistor section adjusts the reference voltage through the cutting of the fuse in a test mode.

The comparator receives the first voltage through a non-inverting terminal, receives the second voltage through an inverting terminal, compares the received first voltage with the received second voltage, and outputs the comparison result.

As described above, a circuit for generating a reference voltage of the present invention outputs the reference voltage adjusted in accordance with a surrounding temperature, and provides a bias voltage corresponding to a threshold voltage of a memory cell changed in accordance with the surrounding temperature using the outputted reference voltage. As a result, an operation error in a memory device may be reduced.

DESCRIPTION OF SPECIFIC EMBODIMENTS

Hereinafter, the embodiments of the present invention will be explained in more detail with reference to the accompanying drawings.

Figure 1:
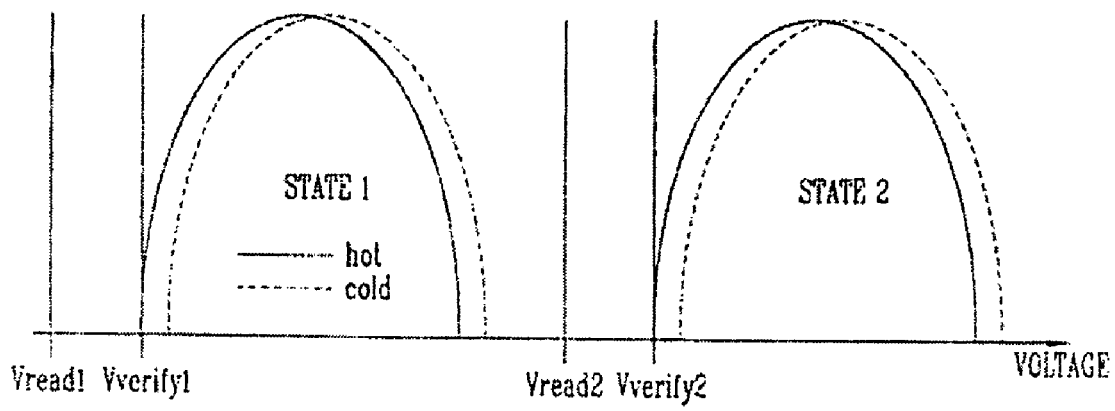
FIG. 1 is a view illustrating a threshold voltage distribution of a memory cell for two temperatures in a common semiconductor memory device.
Figure 2:
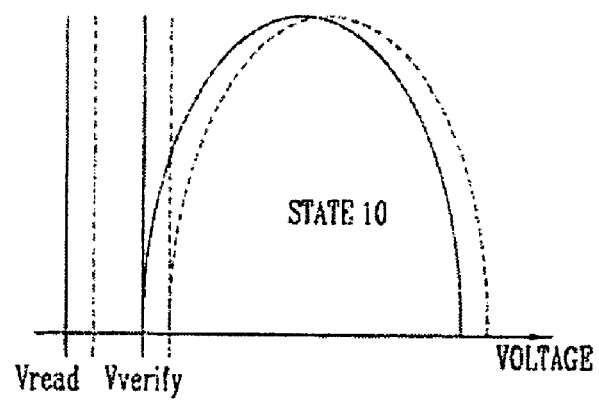
FIG. 2 is a view illustrating a level change of a reference voltage in accordance with temperature according to an embodiment of the present invention.

In FIG. 2, according to an embodiment of the present invention, a memory device adjusts a read voltage $V_{read}$ and a verifying voltage $V_{verify}$ in accordance with a changed cell distribution from a temperature change, and uses the adjusted voltages $V_{read}$ and $V_{verify}$.

Figure 3A:
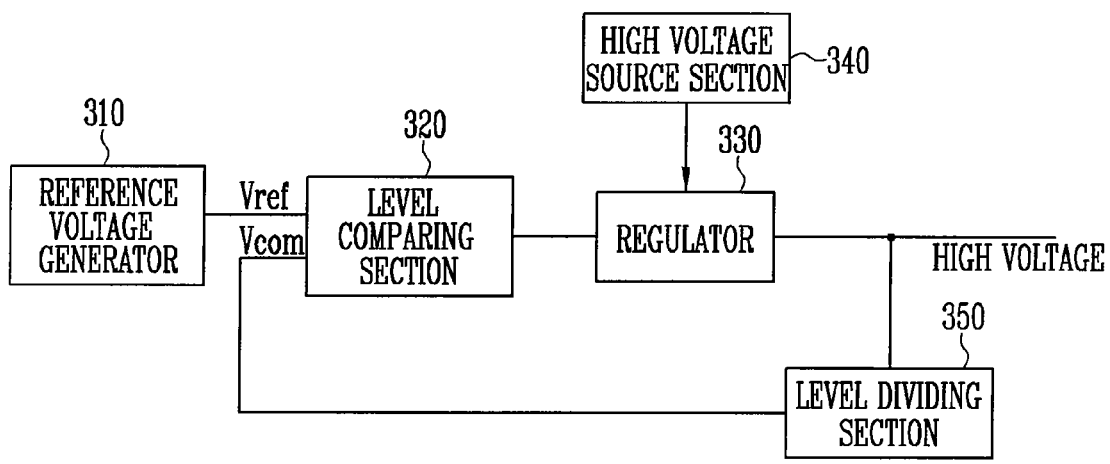
FIG. 3A is a block diagram illustrating a high voltage generator according to an embodiment of the present invention.

FIG. 3A is a block diagram illustrating a high voltage generator according to an embodiment of the present invention.

In FIG. 3A, the high voltage generator 300 of the present embodiment includes a reference voltage generator 310 for generating a reference voltage $V_{ref}$, a level comparing section 320 for comparing the generated reference voltage $V_{ref}$ with a comparing voltage $V_{com}$ and outputting the comparison result, a regulator 330 for outputting a high voltage provided from a high voltage source section 340 in accordance with the comparison result outputted from the level comparing section 320, and a level dividing section 350 for providing the comparing voltage $V_{com}$ generated by dividing a level of the high voltage outputted from the regulator 330 to the level comparing section 320.

The reference voltage generator 310 generates the reference voltage $V_{ref}$ having a level optimized in accordance with the temperature.

The level comparing section 320 receives the reference voltage $V_{ref}$ outputting from the reference voltage generator 310 and the comparing voltage $V_{com}$ outputted from the level dividing section 350, compares the level of the reference voltage $V_{ref}$ with the level of the comparing voltage $V_{com}$, and outputs the comparison result.

The level comparing section 320 outputs a first control signal for driving the regulator 330 when the level of the comparing voltage $V_{com}$ is smaller than a desired reference voltage $V_{ref}$, and outputs a second control signal for turning off the regulator 330 when the level of the comparing voltage $V_{com}$ is higher than the desired reference voltage $V_{ref}$.

The regulator 330 receives the high voltage from the high voltage source section 340, and outputs the received high voltage.

The level dividing section 350 outputs the comparing voltage $V_{com}$ generated by dividing the high voltage outputted from the regulator 330. In this case, the regulator 350 may be manufactured by employing a transistor or a resistor, etc.

The high voltage source section 340 plays a role in providing a source of the regulator 330, and is made up of a pump circuit (not shown).

Hereinafter, the reference voltage generator 310 for generating the reference voltage $V_{ref}$ adjusted in accordance with the temperature will be described in detail with reference to the accompanying drawing.

Figure 3B:
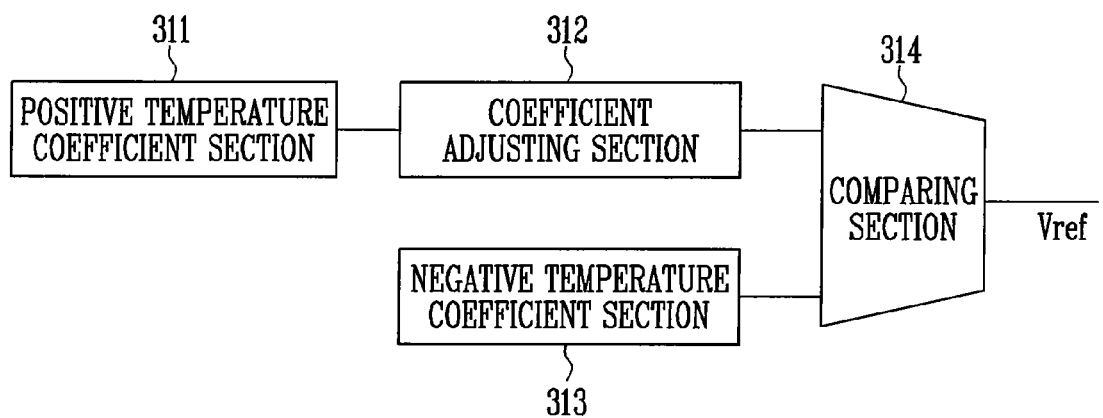
FIG. 3B is a block diagram illustrating the reference voltage generator in FIG. 3A.

FIG. 3B is a block diagram illustrating the reference voltage generator in FIG. 3A.

Referring to FIG. 3B, the reference voltage generator 310 includes a positive temperature coefficient section 311 for providing a coefficient corresponding to a positive temperature, a coefficient adjusting section 312 for adjusting the coefficient provided from the positive temperature coefficient section 311, a negative temperature coefficient section 313 for providing a coefficient corresponding to a negative temperature, and a comparing section 314 for outputting the reference voltage $V_{ref}$ adjusted in accordance with the temperature by using the coefficients provided from the coefficient adjusting section 312 and the negative temperature coefficient section 313.

The positive temperature coefficient section 311 and the negative temperature coefficient section 313 outputs the positive temperature coefficient and the negative temperature coefficient in response to the temperature. Here, since the coefficient adjusting section 312 adjusts the positive temperature coefficient provided from the positive temperature coefficient section 311, the comparing section 314 may output the reference voltage $V_{ref}$ corresponding to the temperature.

The coefficient adjusting circuit 312 adjusts the positive temperature coefficient through a test mode, or adjusts the positive temperature coefficient using a fuse.

Figure 3C:
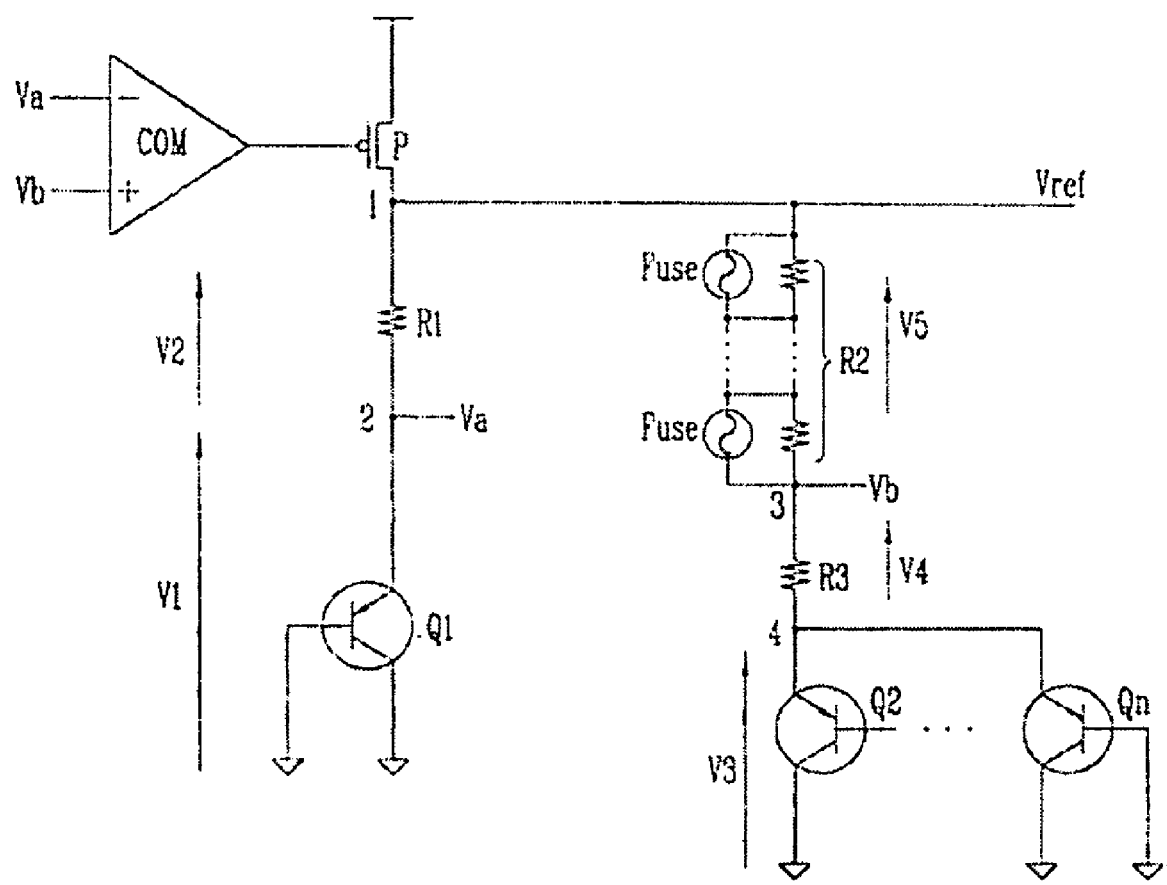
FIG. 3C is a view illustrating a circuitry of the reference voltage generator in FIG. 3B.

FIG. 3C is a view illustrating a circuitry of the reference voltage generator in FIG. 3B.

Referring to FIG. 3C, the reference voltage generator 310 includes a comparator COM, a P-MOS transistor P, a first to third resistors R1 to R3, and a first to nth bipolar transistors Q1 to Qn.

The P-MOS transistor P, the first resistor R1 and the first bipolar transistor Q1 receive a power supply voltage, outputs the reference voltage $V_{ref}$ and a voltage Va for controlling the reference voltage $V_{ref}$ through the negative temperature coefficient in accordance with the operation of the P-MOS transistor P.

The second and third resistors R2 and R3, and the second to nth bipolar transistor Q2 to Qn receive the reference voltage $V_{ref}$, and outputs a voltage Vb for controlling the reference voltage $V_{ref}$ through the positive temperature coefficient. Here, in case that the voltage Vb is adjusted by changing a resistance of the second resistor R2, the reference voltage $V_{ref}$ may be changed in accordance with the temperature.

The power supply voltage is applied to a source of the P-MOS transistor P, and a control signal is provided to a gate of the P-MOS transistor P from the comparator COM. As a result, the P-MOS transistor P switches in response to the control signal, and so the power supply voltage is applied to a first node 1.

The first resistor R1 is coupled between the first node 1 and a second node 2, and the first bipolar transistor Q1 is coupled between the second node 2 and a ground voltage.

The reference voltage $V_{ref}$ is outputted from the first node 1, and the voltage Va is outputted from the second node 2.

The second resistor R2 is coupled between the first node 1 and a third node 3, and the third resistor R3 is coupled between the third node 3 and a fourth node 4. In addition, the second to nth bipolar transistors Q2 to Qn are coupled in parallel between the fourth node 4 and ground voltage. Further, the voltage Vb is outputted from the third node 3.

The comparator COM receives the voltage Va through its inverting terminal (−), and adjusts the reference voltage $V_{ref}$ using the voltage Va so that the reference voltage $V_{ref}$ is inversely proportional to the temperature. Additionally, the comparator COM receives the voltage Vb through its non-inverting terminal (+), and adjusts the reference voltage $V_{ref}$ using the voltage Vb so that the reference voltage $V_{ref}$ is proportional to the temperature.

The comparator COM compares the voltage Va with the voltage Vb, and outputs the control signal in accordance with the comparison result. Here, the control signal controls the P-MOS transistor P.

That is, the voltage Va and the voltage Vb received in the inverting terminal (−) and the non-inverting terminal (+) of the comparator COM acts as the positive temperature coefficient or the negative temperature coefficient.

In the above reference voltage generator 310, a first voltage V1 is applied between the second node 2 and the ground voltage, and a second voltage V2 is provided between the first node 1 and the second node 2. In addition, a fifth voltage V5 is applied between the first node 1 and the third node 3, and a fourth voltage V4 is provided between the third node 3 and the fourth node 4. Moreover, a third voltage V3 is applied between the fourth node 4 and the ground voltage.

The first voltage V1 equals to a voltage $V_{BE}$ between a base and an emitter of the first bipolar transistor Q1. Further, the second voltage V2 is identical to the fifth voltage V5 between the first node 1 and the third node 3, and is expressed below in Equation 1.

$$V2 = V5 = \left(\frac{R2}{R3}\right)dV_{BE},\qquad \text{[Equation 1]}$$

where the $dV_{BE}$ equals to the fourth voltage V4 between the third node 3 and the fourth node 4, and the third voltage V3 applied between the fourth node 4 and the ground voltage is a voltage applied commonly to bases and emitters of the second to nth bipolar transistors Q2 to Qn The reference voltage $V_{ref}$ outputted from the reference voltage generator 310 is expressed below in Equation 2.

$$V_{ref} = V1 + \left(\frac{R2}{R3}\right) \times V_T \ln\left(\frac{N \times R2}{R3}\right) = V1 + \left(\frac{R2}{R3}\right) \times V_T \ln(N), \qquad \text{[Equation 2]}$$

where the N is constant, and $V_T$ is the positive temperature coefficient. Accordingly, the positive temperature coefficient may be changed in accordance with the ratio of the second resistor R2 and the third resistor R3. Hence, the reference voltage generator 310 may generate the reference voltage $V_{ref}$ optimized for the temperature by adjusting the resistance of the second resistor R2 in accordance with the temperature.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A circuit for generating a reference voltage in a memory device, the circuit comprising:
    a switching section configured to control a supply of a power supply voltage in response to a control signal;
    a first voltage generator configured to generate a reference voltage and a first voltage by dividing the power supply voltage provided through the switching section, the first voltage having a negative temperature coefficient characteristic;
    a second voltage generator configured to generate the reference voltage and a second voltage having a positive temperature coefficient characteristic, wherein the second voltage generator comprises:
        a variable resistor section coupled between a first node from which the reference voltage is output and a second node from which the second voltage is output, wherein the variable resistor section comprises at least one resistor, each resistor being operated in accordance with a cutting of a fuse, and
        a plurality of transistors coupled in parallel between the second node and a around voltage; and
    a comparator configured to compare the first voltage with the second voltage, and control the switching section in accordance with the comparison result.

2. The circuit of claim 1, wherein the first voltage generator includes:
    a first resistor coupled between the first node and a third node from which the first voltage is output; and
    a transistor coupled between the first node and the ground voltage,
    wherein the reference voltage is outputted through the first terminal of the switching section, and the first voltage is outputted through the first node.

3. The circuit of claim 1, wherein the variable resistor section adjusts the reference voltage through the cutting of the fuse in a test mode.

4. The circuit of claim 1, wherein the comparator receives the first voltage through an inverting terminal, receives the second voltage through a non-inverting terminal, compares the received first voltage with the received second voltage, and outputs a result of the comparison.

* * * * *